(12) United States Patent
Lee et al.

(10) Patent No.: US 10,078,983 B2
(45) Date of Patent: Sep. 18, 2018

(54) SCAN DRIVER, DISPLAY DEVICE, AND METHOD OF DRIVING DISPLAY DEVICE

(71) Applicant: LG Display Co., Ltd., Seoul (KR)

(72) Inventors: Jungmin Lee, Paju-si (KR); Junho Bong, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 15/293,817

(22) Filed: Oct. 14, 2016

(65) Prior Publication Data

US 2017/0116925 A1  Apr. 27, 2017

(30) Foreign Application Priority Data

Oct. 23, 2015  (KR) .................. 10-2015-0147984

(51) Int. Cl.
| | |
|---|---|
| *G09G 3/3266* | (2016.01) |
| *G09G 3/3225* | (2016.01) |
| *G09G 3/3275* | (2016.01) |
| *G11C 19/18* | (2006.01) |
| *G11C 19/28* | (2006.01) |
| *G09G 3/3233* | (2016.01) |

(52) U.S. Cl.
CPC ......... *G09G 3/3266* (2013.01); *G09G 3/3225* (2013.01); *G09G 3/3275* (2013.01); *G11C 19/186* (2013.01); *G11C 19/28* (2013.01); *G09G 3/3233* (2013.01); *G09G 2300/043* (2013.01); *G09G 2300/0861* (2013.01); *G09G 2310/0251* (2013.01); *G09G 2310/0262* (2013.01); *G09G 2310/0286* (2013.01); *G09G 2310/0289* (2013.01); *G09G 2310/08* (2013.01)

(58) Field of Classification Search
CPC .. G09G 3/3266; G09G 3/3275; G09G 3/3225; G09G 3/30; G09G 3/34
See application file for complete search history.

(56) References Cited

U.S. PATENT DOCUMENTS

| | | | |
|---|---|---|---|
| 2009/0256785 A1* | 10/2009 | Sung ................... | G09G 3/3258 345/77 |
| 2015/0138180 A1 | 5/2015 | Park et al. | |

OTHER PUBLICATIONS

European Search Report dated Mar. 3, 2017 for European patent application No. 16194061.4.

* cited by examiner

*Primary Examiner* — Michael Faragalla
(74) *Attorney, Agent, or Firm* — Polsinelli PC (57) ABSTRACT

The present disclosure provides a display device including a display panel and a scan driver. The display panel displays an image. The scan driver includes a scan signal generation circuit disposed on one side of the display panel, and an emission signal generation circuit disposed on the other side of the display panel. The emission signal generation circuit outputs an emission signal having at least two Logic High sections in response to an external clock signal and first and second scan signals output from the scan signal generation circuit.

9 Claims, 9 Drawing Sheets

RELATED ART

Fig. 4

RELATED ART

SCAN DRIVER, DISPLAY DEVICE, AND METHOD OF DRIVING DISPLAY DEVICE

CROSS-REFERENCE TO RELATED APPLICATION

This application claims the priority benefit of Korean Patent Application No. 10-2015-0147984, filed in the Republic of Korea on Oct. 23, 2015, which is incorporated herein by reference in its entirety for all purposes as if fully set forth herein.

BACKGROUND

Field of the Disclosure

The present disclosure relates to a display device, and more particularly, to a scan driver, a display device, and a method of driving the display device. Although the present disclosure is suitable for a wide scope of applications, it is particularly suitable for implementing a narrow bezel on a display panel.

Description of the Background

With development of information technologies, the display device market is growing. A display device is a medium which enables connection between a user and information. The display device includes an organic light emitting display (OLED), a liquid crystal display (LCD), and a plasma display panel (PDP), and it is being widely used these days.

Some of the examples of the display device, such as LCD or OLED, operate in a manner that a selected sub-pixel emits light once a scan signal and a data signal is supplied to sub-pixels included in a display panel.

The display device includes a display panel having a plurality of sub-pixels and a driver for driving the display panel. The driver includes a scan driver for supplying a scan signal (or a gate signal) to the display panel, and a data driver for supplying a data signal to the display panel.

The scan driver may be in embedded in the display panel, and, in this case, the scan driver is the form of an integrated circuit (IC) or in the form of gate in panel (GIP) by performing a thin film transistor (TFT) manufacturing process.

The GIP-type scan driver includes a shift register and an inverter. The shift register receives a clock signal from an external device and generates scan signals sequentially based on the clock signal. The inverter receives an output signal of the shift register and a clock signal, and generates an emission signal based thereon.

However, when a related art GIP-type scan driver is used, it is difficult to implement a narrow bezel on the display panel due to layout limitation and complexity in the circuits of the shift register and the inverter.

SUMMARY

In one general aspect, there is provided a display device including a display panel and a scan driver. The display panel displays an image. The scan driver includes a scan signal generation circuit disposed on one side of the display panel, and an emission signal generation circuit disposed on the other side of the display panel. The emission signal generation circuit outputs an emission signal having at least two Logic High sections in response to an external clock signal and first and second scan signals output from the scan signal generation circuit.

In another general aspect, there is provided a scan driver including a scan signal generation circuit and an emission signal generation circuit. The emission signal generation circuit outputs an emission signal having at least two Logic High sections in response to an external clock signal and first and second scan signals output from the scan signal generation circuit.

In yet another general aspect, there is provided a method of driving a display device which includes a display panel for displaying an image and a scan driver, wherein the scan driver includes a scan signal generation circuit disposed on one side of the display panel and an emission signal generation circuit disposed on the other side of the display panel. The method includes outputting, by the emission signal generation circuit, an emission signal having at least two Logic High sections in response to an external clock signal and first and second scan signals output from the scan signal generation circuit.

BRIEF DESCRIPTION OF THE DRAWINGS

The accompany drawings, which are included to provide a further understanding of the disclosure and are incorporated on and constitute a part of this specification illustrate the present disclosure and together with the description serve to explain the principles of the present disclosure.

DETAILED DESCRIPTION

Reference will now be made in detail to aspects of the present disclosure examples of which are illustrated in the accompanying drawings. Whenever possible, the same reference numbers will be used throughout the drawings to refer to the same or like parts.

Hereinafter, aspects of the present disclosure are described with accompanying drawings.

A display device according to the present disclosure is implemented as a television, a set-top box, a navigation device, a video player, a Blu-ray player, a personal computer (PC), a home theater, and a mobile phone, etc. The display device may be selected from among a liquid crystal display, an organic light-emitting diode display device, a quantum dot display device, an electrophoretic indication display device, and a plasma display device, but it is not limited thereto. In the following descriptions, the organic light-emitting diode display device is taken as an example of the display device for convenience of explanation. In addition, except for a gate electrode, transistors may be referred to as a source electrode and a drain electrode, or a drain electrode and a source electrode, depending on the type of the transistors. However, the transistors are herein called first and second electrodes to avoid limitation.

Figure 1:
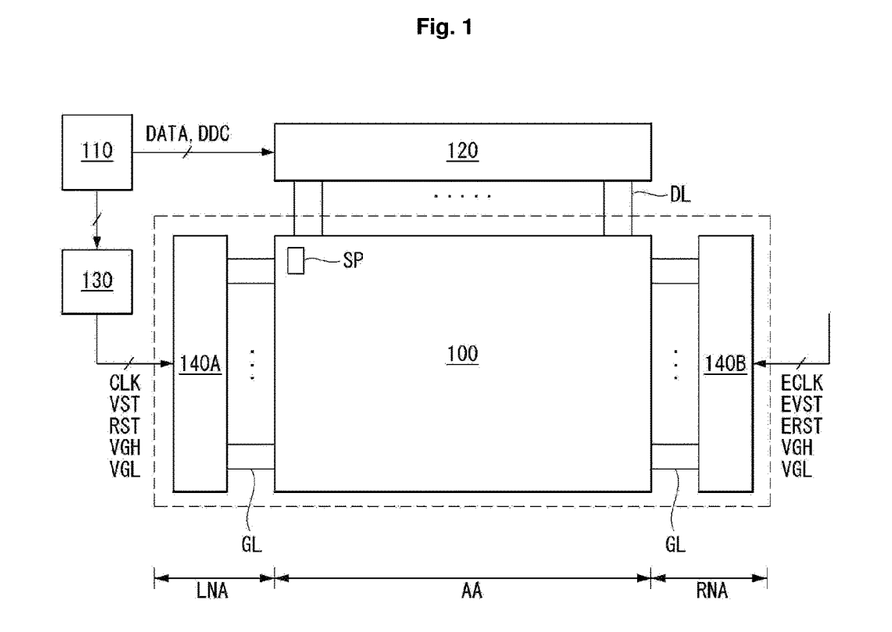
FIG. 1 is a schematic block diagram illustrating a display device.
Figure 2:
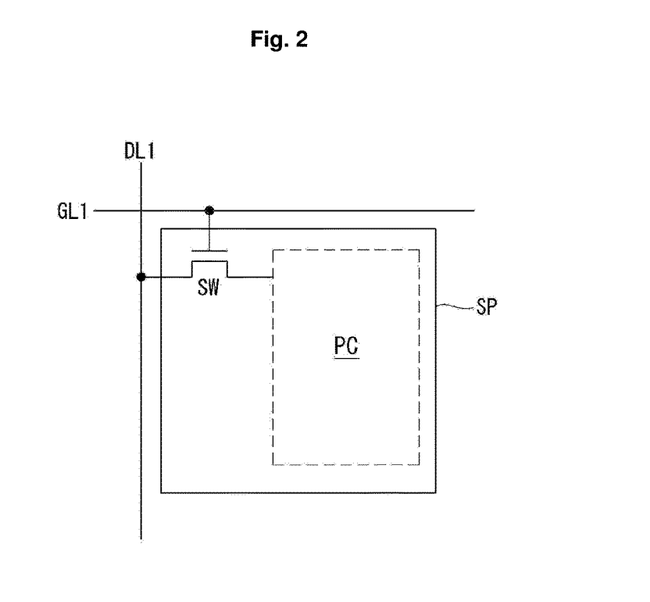
FIG. 2 is a diagram illustrating a sub-pixel shown in FIG. 1.

FIG. 1 is a schematic block diagram illustrating a display device, and FIG. 2 is a diagram illustrating a sub-pixel shown in FIG. 1.

As illustrated in FIG. 1, a display device includes a display panel 100, a timing controller 110, a data driver 120, and a scan driver 130, 140A, and 140B.

The display panel 100 includes sub-pixels that are connected to each other and respectively defined by data lines DL and scan lines GL which intersect the data lines DL. The display panel 100 is sealed so as to protect at least one film, a substrate, or sub-pixels formed thereon from outdoor air such as moisture and oxygen.

The display panel 100 includes a display area AA, on which sub-pixels are formed, and non-display areas LNA and RNA which are disposed lateral to the display area AA and on which various signal lines or pads are formed. The display panel 100 may be implemented by a top-emission method, a bottom-emission method, or a dual-emission method, depending on the configuration of sub-pixels SP.

As illustrated in FIG. 2, one sub-pixel SP includes a switching transistor SW connected to a scan line GL1 and a data line DL1, and a pixel circuit PC operating in response to a data signal DATA (shown in FIG. 1) which is supplied in response to a scan signal supplied through the switching transistor SW. The pixel circuit PC of the sub pixel SP may be formed to further include a drive transistor, a storage capacitor, an organic light emitting diode (OLED), and various types of compensation circuits.

The timing controller 110 may receive timing signals through an LDVS or TMDS interface receiver circuit connected to a video board. The timing signals may include a vertical synchronization signal, a horizontal synchronization signal, a data enable signal, and a dot clock. With reference to an input timing signal, the timing controller 110 generates timing control signals for controlling operation timing of the data driver 120 and the scan driver 130, 140A, and 140B.

The data driver 120 includes a plurality of source drive integrated circuits (ICs). The source drive ICs are supplied with a data signal DATA and a source timing control signal DDC from the timing controller 110. The source drive ICs convert the form of the data signal DATA from a digital signal into an analog signal in response to the source timing control signal, and supplies the analog signal through the data lines DL of the display panel 100. The source drive ICs are connected to the data lines DL of the display panel 100 by a chip on glass (COG) process or a tape automated bonding (TAB) process.

The scan driver 130, 140A, and 140B may be further defined as a level shifter circuit 130, and signal generation circuit 140A and 140B, respectively.

The level shifter circuit 130 may be referred to as a power supply unit. Thus, the level shifter circuit 130 may be defined as an independent component not included in the scan driver 130, 140A, and 140B. In the following description, however, the level shifter circuit 130 is depicted as being included in the scan driver 130, 140A, and 140B for convenience of explanation.

The level shifter circuit 130 is formed on an external substrate connected in the form of an IC to the display panel 100. Under the control of the timing controller 110, the level shifter circuit 130 may shift a level of a signal or voltage which is supplied through a clock signal line, a start signal line, a reset signal line, a gate high voltage line, and a gate low voltage line. Then, the level shifter circuit 130 supplies the level-shifted signal or voltage to the signal generation circuit 140A and 140B.

The signal generation circuit 140A and 140B are formed in the form of a thin film transistor (TFT) on the display panel 100 in a gate in panel (GIP) method. The signal generation circuit 140A and 140B are respectively formed on the left-hand non-display area LNA and the right-hand non-display area RNA of the display panel 100. The signal generation circuit 140A and 140B are composed of stages which shift and output a scan signal based on a signal or voltage CLK, ECLK, VST, EVST, RST, ERST, VGH, or VGL output from the level shifter. The signal generation circuit 140A and 140B may be configured in various ways with signal lines and voltage lines along which the signal or voltage CLK, ECLK, VST, EVST, RST, ERST, VGH, or VGL is output bypassing the data driver.

The signal generation circuit 140A and 140B can be further defined as a scan signal generation circuit 140A for outputting a scan signal for turning on or off switching transistors included in sub-pixels, and an emission signal generation circuit 140B for outputting an emission signal for turning on or off emission control transistors included in the sub-pixels. The scan signal generation circuit 140A and the emission signal generation circuit 140B may be arranged opposite to the configuration shown in FIG. 1.

Hereinafter, problems of the related art scan driver and examples for solving the problems are explained.

<Related Art Structure>

Figure 3:
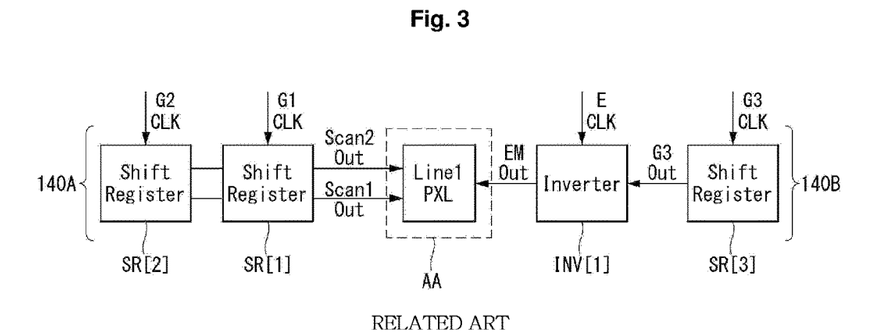
FIG. 3 is a schematic block diagram illustrating part of a related art scan driver.
Figure 4:
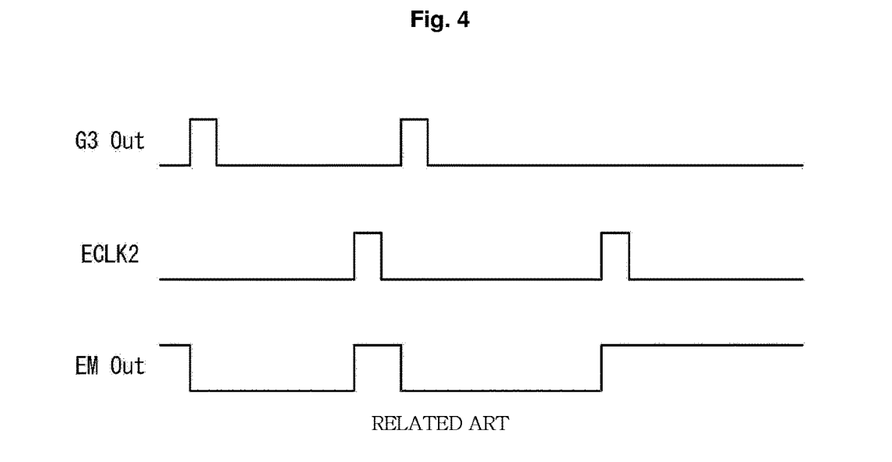
FIG. 4 is a waveform view illustrating input and output waveforms of an emission signal generation circuit shown in FIG. 3.

FIG. 3 is a schematic block diagram illustrating part of a related art scan driver, and FIG. 4 is a waveform view illustrating input and output waveforms of an emission signal generation circuit shown in FIG. 3.

As illustrated in FIG. 3, a signal generation circuit 140A and 140B of the related art scan driver includes a scan signal generation circuit 140A for outputting a scan signal for turning on or off switching transistors included in sub-pixels PXL, and an emission signal generation circuit 140B for outputting an emission signal for turning on or off emission control transistors included in the sub-pixels PXL.

The scan signal generation circuit 140A includes first and second shift registers SR[1] and SR[2] to receive a clock signal and generate sequential scan signals based on the clock signal. The emission signal generation circuit 140B includes a first inverter circuit INV[1] to receive an output signal and a clock signal from a third shift register SR[3] and generate an emission signal based on the output signal and the clock signal. The above configurations of the scan signal generation circuit 140A and the emission signal generation circuit 140B are arranged in the form of multiple stages so as to drive sub-pixels PXL existing on each line.

Sub-pixels PXL existing on one line Line 1 operates based on a first scan signal Scan 1 Out output from the first shift register SR[1], a second scan signal Scan 2 Out output from the second shift register SR[2], and an emission signal EM Out output from the first inverter circuit INV[1].

As illustrated in FIGS. 3 and 4, the emission signal generation circuit 140B forms a rising edge of a signal output from itself by synchronizing with a rising edge of a second clock signal ECLK2 supplied to itself. The emission signal generation circuit 140B forms a falling edge of a signal output from itself by synchronizing with a rising edge of an output signal G2 Out transmitted from the shift register SR[3].

The signal generation circuit 140A and 140B of the related art scan driver further includes four shift registers and a single inverter in order to drive sub-pixels existing on a single line Line 1. In particular, the emission signal generation circuit 140B needs to further include two additional shift registers in order to generate an emission signal EM Out increasing circuit complexity and layout limitation.

As a result, the related art scan driver is difficult to secure the design margin due to the circuit complexity and layout limitation, so it is difficult to implement a narrow bezel in the display panel.

First Embodiment

Figure 5:
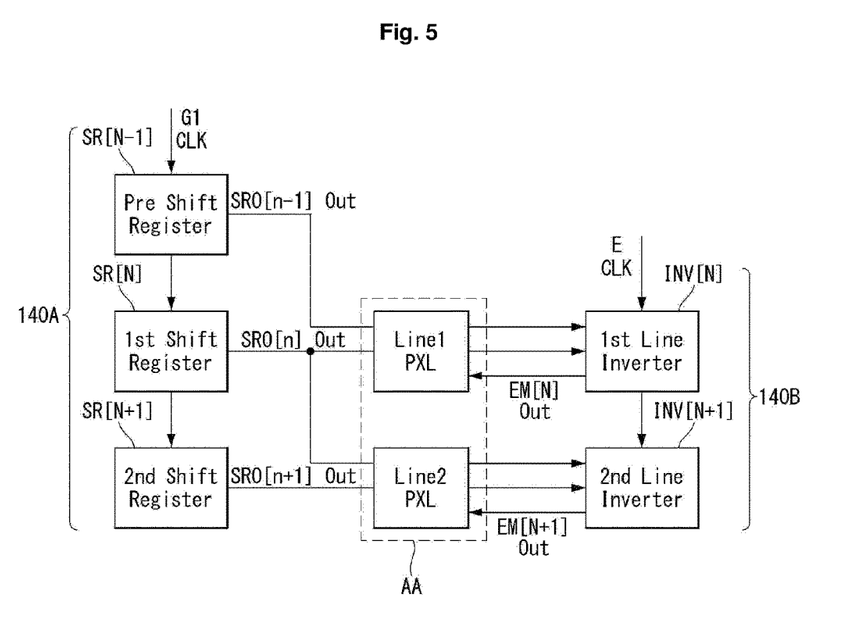
FIG. 5 is a schematic block diagram illustrating part of a scan driver according to a first embodiment of the present disclosure.
Figure 6:
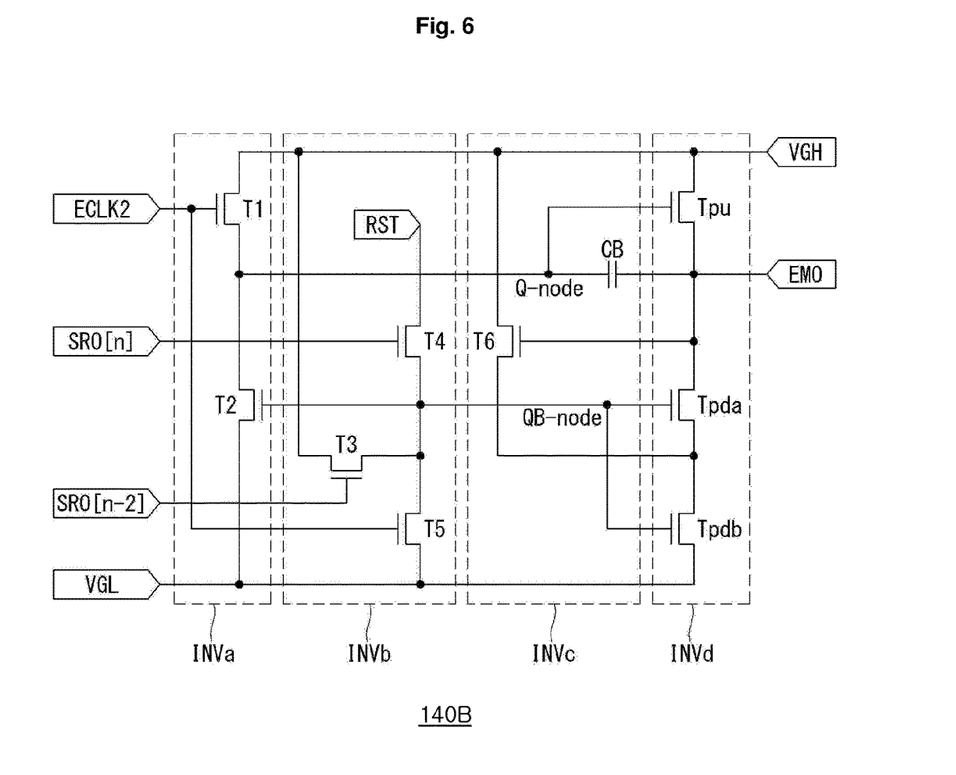
FIG. 6 is a diagram illustrating an emission signal generation circuit according to the first embodiment of the present disclosure.
Figure 7:
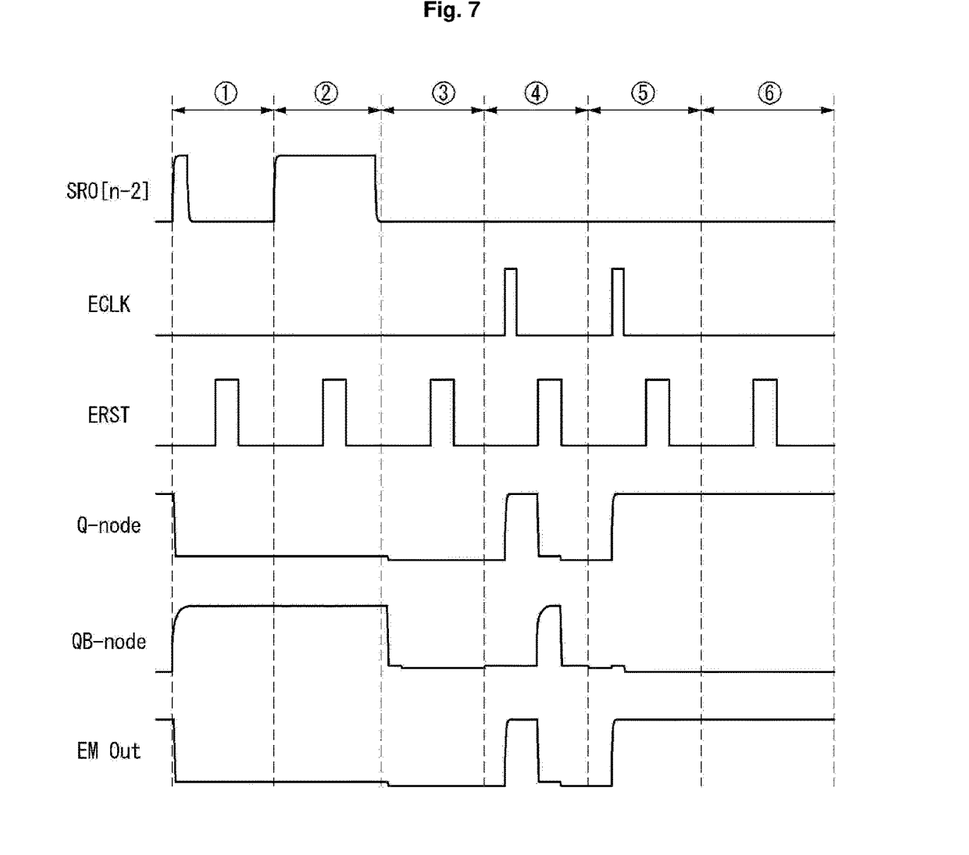
FIG. 7 is a waveform view illustrating input and output waves of the emission signal generation circuit shown in FIG. 6

FIG. 5 is a schematic block diagram illustrating part of a scan driver according to a first embodiment of the present disclosure, FIG. 6 is a diagram illustrating an emission signal generation circuit according to the first embodiment of the present disclosure, and FIG. 7 is a waveform view illustrating input and output waves of the emission signal generation circuit shown in FIG. 6.

As illustrated in FIG. 5, a signal generation circuit 140A and 140B of a scan driver according to the first embodiment of the present disclosure can be further defined as a scan signal generation circuit 140A for outputting a scan signal for turning on or off switching transistors included in sub-pixels PXL, and an emission signal generation circuit 140B for outputting an emission signal for turning on or off emission control transistors included in the sub-pixels PXL.

The scan signal generation circuit 140A includes (N−1)-th and N-th register circuits SR[N−1] and SR[N] to receive a clock signal CLK and generate sequential scan signals based on the clock signal CLK. The emission signal generation circuit 140B includes an inverter circuit INV[N] to receive a clock signal ECLK and generate an emission signal based on the clock signal ECLK. The above configurations of the scan signal generation circuit 140A and the emission signal generation circuit 140B are arranged in the form of multiple stages in order to drive sub-pixels PXL existing on each line.

Sub-pixels existing on one line Line 1 operate based on an (N−1)-th scan signal SRO[n−1] Out output from the (N−1)-th shift register SR[N−1], an N-th scan signal SRO[n] Out output from the N-th shift register SR[N], and an N-th emission signal EM[N] Out output from the N-th inverter INV[N].

Existing on a second line Line 2 in the above structure, sub-pixels PXL operate based on the N-th scan signal SRO[n] Out output from the N-th shift register SR[N], an (N+1)-th scan signal SRO[n+1] Out output from a (N+1)-th shift register SR[N+1], and an (N+1)-th emission signal EM[N+1] Out output from an (N+1)-th inverter INV[N+1].

The signal generation circuit 140A and 140B of the scan driver according to the first embodiment of the present disclosure further includes two shift registers and a single inverter circuit in order to drive the sub-pixels PXL existing on one line Line 1. In the scan signal generation circuit 140A, the shift registers are connected dependently. However, the emission signal generation circuit 140B does not need an additional shift register to generate an emission signal EM out, and it can reduce circuit complexity and layout limitation, compared to the configuration of the related art scan driver.

As a result, compared to the related art scan driver, the scan driver according to the first embodiment of the present disclosure reduces the circuit complexity and overcome layout limitation, thereby securing the design margin and overcoming the problems in implementing a narrow bezel. In addition, the scan driver according to the first embodiment of the present disclosure can reduce circuit complexity compared to the related art scan driver, thereby securing a sufficient encapsulation margin and improving a device reliability.

To this end, the emission signal generation circuit 140B is configured to generate the N-th emission signal EM[N] Out based on the clock signal ECLK and output signals SRO[n−1] Out and SRO[n] Out output from the (N−1)-th and N-th shift registers SR[N−1] and SR[N] of the scan signal generation circuit 140A.

As such, the emission signal generation circuit 140B according to the first embodiment of the present disclosure uses the output signals SRO[n−1] Out, SRO[n] Out output from the (N−1)-th and N-th shift registers SR[N−1] and SR[N] disposed on the opposite side comparing to the related art scan driver. The output signals SRO[n−1] Out and SRO[n] Out output from the (N−1)-th and N-th shift registers SR[N−1] and SR[N] are supplied to the emission signal generation circuit 140B through the display area AA.

The emission signal generation circuit 140B may generate an emission signal EM[N] Out based on an output signal output not only from the (N−1)-th shift register SR[N−1] existing on a previous stage of the N-th shift register SR[N], but from an (N−x)−1 stage (x is an integer equal to or greater than 1, and it may be, for example, an (N−2)-th shift register), an output signal SRO[n] Out output from the N-th shift register, and a clock signal ECLK.

Meanwhile, if the (N−1)-th shift register SR[N−1] corresponds to a pre shift register existing on the top stage (i.e., the forefront stage), the (N−1)-th shift register may be configured as a dummy shift register, but it is not limited thereto.

The aforementioned signal generation circuit 140A and 140B operates based on different-phase clock signals. For example, a clock signal CLK supplied to the scan signal generation circuit 140A may be comprised of at least four phases, and a clock signal ECLK supplied to the emission signal generation circuit 140B may be comprised of at least two phases. However, aspects of the present disclosure are not limited thereto.

Hereinafter, a configuration of the emission signal generation circuit 140B according to the first embodiment of the present disclosure is described. It is an example in which the emission signal generation circuit 140B operates in response to an output signal of the (N−2)-th shift register, an output signal of the N-th shift register, and a clock signal.

As illustrated in FIG. 6, the emission signal generation circuit 140B includes a first circuit INVa for controlling charging and discharging of a Q node Q-node, a second circuit INVb for controlling charging and discharging of a QB node QB-node, and a third circuit INVc for stabilizing an output terminal EMO of the emission signal generation circuit 140B, and a fourth circuit INVd for outputting a Logic-High or Logic-Low emission signal through an output terminal EMO of the emission signal generation circuit 140B.

The first circuit INVa further includes a first transistor T1 and a second transistor T2. The first transistor T1 is configured to charge the Q node Q-node to a gate high voltage in response to an N-th clock signal. The second transistor T2 is configured to discharge the Q node Q-node in response to a potential of the QB node QB-node.

The first transistor T1 is configured such that a gate electrode thereof is connected to an N-th clock signal line (which is depicted as a second clock signal line ECLK2 in the embodiment), a first electrode thereof is connected to a gate high voltage line VGH, and a second electrode thereof being connected to the Q node Q-node. The second transistor T2 is configured such that a gate electrode thereof is connected to the QB node QB-node, a first electrode thereof is connected to a gate low voltage line VGL, and a second electrode thereof is connected to the Q node Q-node.

The second circuit INVb further includes third to fifth transistors T3 to T5. The third transistor T3 is configured to charge the QB node QB-node to a gate high voltage in response to an output signal of an (N−2)-th shift register. The fourth transistor T4 is configured to reset the QB node using a reset signal in response to the output signal of the N-th shift register. The fifth transistor T5 is configured to discharge the QB node QB-node to a gate low voltage in response to an N-th clock signal.

The third transistor T3 is configured such that a gate electrode thereof is connected to an output terminal SRO[N−2] of the (N−2)-th shift register, a first electrode thereof is connected to the gate high voltage line VGH, and a second electrode thereof is connected to the QB node. The fourth transistor T4 is configured such that a gate electrode thereof is connected to an output terminal SRO[N] of the N-th shift register, a first electrode thereof is connected to a reset signal line ERST, and a second electrode thereof is connected to the QB node QB-node. The fifth transistor T5 is configured such that a gate electrode thereof is connected to an N-th clock signal line (which is depicted as a second clock signal line ECLK2 in the embodiment), a first electrode thereof is connected to a gate low voltage line VGL, and a second electrode thereof is connected to the QB node.

The third circuit INVc further includes a sixth transistor T6 and a first capacitor CB. The sixth transistor T6 is configured to stabilize a node connected to electrodes of pull down transistors Tpda and Tpdb in response to a potential of an output terminal EMO of the emission signal generation circuit 140B. By maintaining the node, which is connected to electrodes of the pull down transistors Tpda and Tpdb, at Logic High, the sixth transistor T6 stabilizes an operation of outputting an emission signal at a gate high voltage. The first capacitor CB is configured to cause boot strap to occur in the output terminal EMO of the emission signal generation circuit 140B.

The sixth transistor T6 is configured such that a gate electrode thereof is connected to the output terminal EMO of the emission signal generation circuit 140B, a first electrode thereof is connected to the gate high voltage line VGH, and a second electrode thereof is connected to a node located between a first electrode of the first pull-down transistor Tpda and a second electrode of the second pull-down transistor Tpdb. The first capacitor CB is configured such that one end thereof is connected to the Q node Q-node and the other end thereof is connected to the output terminal EMO of the emission signal generation circuit 140B.

The fourth circuit INVd further includes a pull-up transistor Tpu and pull-down transistors Tpda and Tpdb. The pull-up transistor Tpu is configured to output a gate high voltage through the output terminal EMO of the emission signal generation circuit 140B in response to a potential of the Q node Q-node. The pull-down transistors Tpda and Tpdb are each configured to output a gate low voltage through the output terminal EMO of the emission signal generation circuit 140B in response to a potential of the QB node QB-node.

The pull-up transistor Tpu is configured such that a gate electrode thereof is connected to the Q node Q-node, a first electrode thereof is connected to the gate high voltage line VGH, and a second electrode thereof is connected to the output terminal EMO of the emission signal generation circuit 140B. A first pull-down transistor Tpda is configured such that a gate electrode thereof is connected to the QB node QB-node, a first electrode thereof is connected to a second electrode of a second pull-down transistor Tpdb, and a second electrode thereof is connected to the output terminal EMO of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda.

Hereinafter, the operation of the emission signal generation circuit 140B according to the first embodiment of the present disclosure is described.

As illustrated in FIGS. 6 and 7, when the N-th clock signal ECLK is not at Logic High, the Q node Q-node is maintained in a discharging state, while the QB node QB-node is maintained in a charging state. At this point, the second transistor T2 is turned on, the QB node QB-node is discharged, and the first and second pull-down transistors Tpda and Tpdb are turned on. Thus, an emission signal at a gate low voltage corresponding to Logic Low is output from the output terminal EMO of the emission signal generation circuit 140B (see Sections ① and ②).

When a scan signal at a gate high voltage corresponding to Logic High is output from an output terminal SRO[N−2] of the (N−2)-th shift register and a potential of the QB node QB-node becomes Logic High, the second transistor T2 is turned on. At this point, the Q node Q-node is discharged to a gate low voltage, and the first and second pull-down transistors Tpda and Tpdb are turned on. Thus, an emission signal at the gate low voltage corresponding to Logic Low is output from the output terminal EMO of the emission signal generation circuit 140B (see Section ③).

When a potential of the QB node QB-node is logic low and the first Logic High of the N-th clock signal ECLK happens, the first transistor T1 and the fifth transistor 5 are turned on. At this time the Q node Q-node is charged to the gate high voltage and the pull-up transistor Tpu is turned on. Thus, an emission signal at the gate high voltage corresponding to Logic High is output from the output terminal EMO of the emission signal generation circuit 140B (see Section ④). At this point, the emission signal at the gate high voltage output from the output terminal EMO of the emission signal generation circuit 140 lasts until a section in which the potential of the QB node QB-node is discharged to Logic Low.

When a scan signal at the gate high voltage corresponding to Logic High is output from the output terminal SRO[N] of the N-th shift register and a reset signal ERST becomes Logic High, the QB node QB-node returns to the charging stage. At this point, the second transistor T2 is turned on, the Q node Q-node is discharged, and the first and second pull-down transistors Tpda and Tpdb are turned on. Thus, an emission signal at the gate low voltage corresponding to Logic Low is output from the output terminal EMO of the emission signal generation circuit 140B (see between Sections ④ and ⑤).

When a potential of the QB node QB-node is Logic Low and the second Logic High appears at the N-th clock signal ECLK, the first transistor T1 and the fifth transistor T5 are turned on. At this point, the Q node is charged to the gate high voltage, and the pull-up transistor Tpu is turned on.

Thus, an emission signal at the gate high voltage corresponding to Logic High is output from the output terminal EMO of the emission signal generation circuit 140B (see Sections ⑤ and ⑥). At this point, the emission signal at the gate high voltage output from the output terminal EMO of the emission signal generation circuit 140B last until a section in which a potential of the QB node QB-node is charged to Logic High.

In addition, the emission signal at the gate high voltage output from the output terminal EMO of the emission signal generation circuit 140 can be varied to a clock signal (for example, ECLK and ERST). Therefore, a pulse width of the emission signal can be adjusted, thereby reducing a lateral current. As a result, an initial time can be sufficiently adjusted, and a stable operation is achieved.

The above-described scan driver can be applied to any display device which is implemented by sub-pixels having the following circuit structure.

Figure 8:
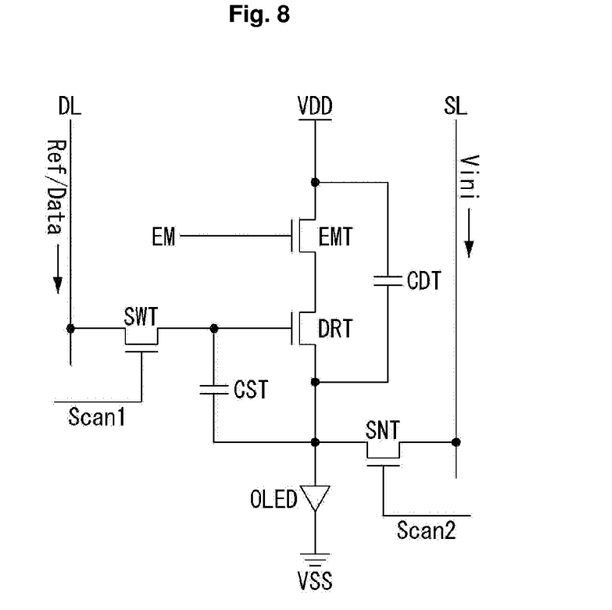
FIG. 8 is a diagram illustrating details of a sub-pixel shown in FIG. 2.
Figure 9:
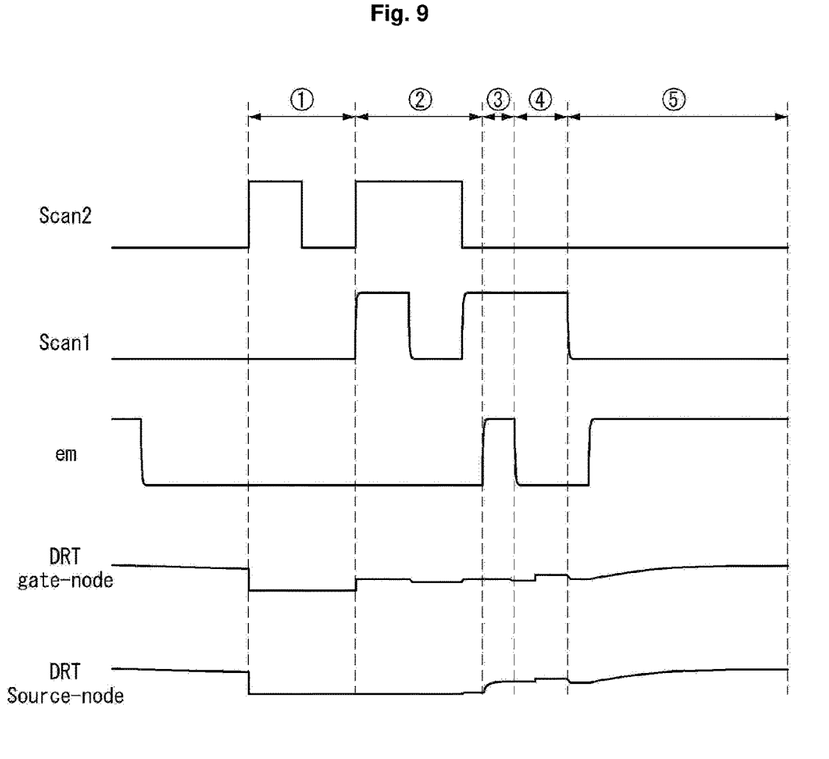
FIG. 9 is a waveform view showing an output waveform of a scan driver according to the first embodiment of the present disclosure and a node voltage of a driving transistor.

FIG. 8 is a diagram illustrating details of a sub-pixel shown in FIG. 2, and FIG. 9 is a waveform view showing an output waveform of a scan driver according to the first embodiment of the present disclosure and a node voltage of a driving transistor.

Hereinafter, the circuit structure of a sub pixel according to the present disclosure is described.

As illustrated in FIG. 8, a sub pixel has a circuit structure with four transistors, two storage capacitors, and an organic light-emitting diode (OLED). The four transistors include a switching transistor SWT, an emission control transistor EMT, a driving transistor DRT, and a sensing transistor SNT. The two storage capacitors include a first storage capacitor CST, and a second storage capacitor CDT.

The switching transistor SWT is configured to transmit a reference voltage Ref or a data voltage Data to one end of the first storage capacitor CST. The switching transistor SWT is configured such that a gate electrode thereof is connected to a first scan line Scan1, a first electrode thereof is connected to a data line DL, and a second electrode thereof is connected to one end of the first storage capacitor CST and a gate electrode of the driving transistor DRT.

The emission control transistor EMT is configured to supply power of a first power so as to control an actual light-emitting time of the OLED. The emission control transistor EMT is configured such that a gate electrode thereof is connected to an emission signal line EM, a first electrode thereof is connected to a first power line VDD, and a second electrode thereof is connected to a first electrode of the driving transistor DRT.

The driving transistor DRT is configured to generate a driving current, which enables the OLED to emit light, in response to a data voltage stored in the first storage capacitor CST. The driving transistor DRT is configured such that a gate electrode thereof is connected to one end of the first storage capacitor CST, a first electrode thereof is connected to the second electrode of the emission control transistor EMT, and a second electrode thereof is connected to an anode electrode of the OLED.

The sensing transistor SNT is configured to supply an initial voltage Vini to a sensing node for initialization and to sense characteristics of the driving transistor DRT and the OLED (for example, a threshold voltage and a current mobility). The sensing transistor SNT is configured such that a gate electrode thereof is connected to a second scan line Scan2, a first electrode thereof is connected to a sensing line SL, and a second electrode thereof is connected to the anode electrode of the OLED and to one end of the first storage capacitor CST.

The first storage capacitor CST is configured to transmit a stored data voltage to the gate electrode of the driving transistor DRT. The first storage capacitor CST is configured such that one end thereof is connected to the first electrode of the driving transistor DRT and the other end thereof is connected to the sensing node.

The second storage capacitor CDT is configured to improve driving efficiency by a driving current in a manner that variation of a source electrode is reflected by variation of the gate electrode of the driving transistor DRT when the reference voltage Ref is changed into the data voltage Data. The second storage capacitor CDT is configured such that one end thereof is connected to a first power line VDD and the other end thereof is connected to the second electrode of the driving transistor DRT.

The OLED is configured to emit light in response to a driving current generated by the driving transistor DRT. The OLED is configured such that an anode electrode thereof is connected to the sensing node and a cathode electrode thereof is connected to a second power line VSS.

Hereinafter, the operation of a sub-pixel according to the present disclosure is described.

As illustrated in FIGS. 8 and 9, an emission signal em remains at Logic Low, and a second scan signal Scan 2 at a gate high voltage is output through an output terminal SRO[2] of a second shift register. Then, a sensing node (or a source node) of the driving transistor DRT is initialized to an initial voltage Vini (see Section ①).

An emission signal em is maintained at Logic Low, a second scan signal Scan2 at the second gate high voltage is output from the output terminal SRO[N−1] of the (N−1)-th shift register, and a first scan signal Scan 1 at the first gate high voltage is output from the output terminal SRO[N] of the N-th shift register. Then, a drain node of the driving transistor DRT is set to a reference voltage Vref, and the sensing node of the driving transistor DRT is initialized to the initial voltage Vini (see Section ②).

The first scan signal Scan 1 at the second gate high voltage is output from the output terminal SRO[N] of the N-th shift register, and the emission signal em is changed to Logic High (i.e., a first emission signal). Then, the driving transistor DRT performs sampling (for example, sampling of a threshold voltage) (see Section ③).

The first scan signal Scan 1 at the second gate high voltage, which is output from the output terminal SRO [N] of the N-th shift register, is maintained, and the emission signal em is changed to Logic Low. Then, a reference voltage Vref supplied through a data line DL is changed into a data voltage Data and programmed to the first storage capacitor CST (see Section ④).

A scan signal Scan 1 at a gate high voltage is output from the output terminal SRO[N] of the N-th shift register, and the emission signal em is changed to Logic Low (the second emission signal). Then, the driving transistor DRT generates a driving current in response to a data voltage programmed to the first capacitor CST, and the OLED emits in response to the driving current (see Section ⑤).

The above-described sub-pixel needs an emission signal em having at least two Logic High sections in order to perform the sampling operation ③ and the emission operation ⑤. An emission signal em is generated by an emission signal generation circuit of a scan driver according to the first embodiment of the present disclosure.

In the example shown in FIG. 9, each of the first scan signal Scan 1, the second scan signal Scan 2, and the emission signal em is generated having a first signal with a short Logic High section and a second signal with a Logic High section longer than that of the first signal. In addition, in the example shown in FIG. 9, a Logic High section of the first scan signal Scan 1 partly overlaps a Logic High section of the second scan signal Scan 2, and the first Logic High section of the emission signal em overlaps the second Logic Low section of the first scan signal Scan 1. However, the waveform shown in FIG. 9 is merely an example, and it may vary with a clock signal and a reset signal.

Second Embodiment

Figure 10:
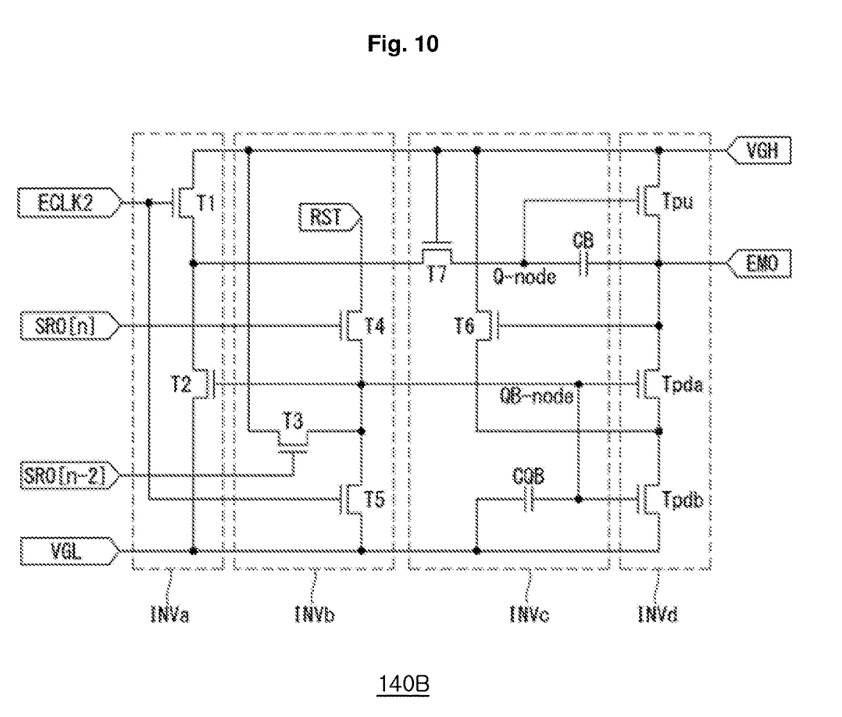
FIG. 10 is a diagram illustrating an emission signal generation circuit according to a second embodiment of the present disclosure.
Figure 11:
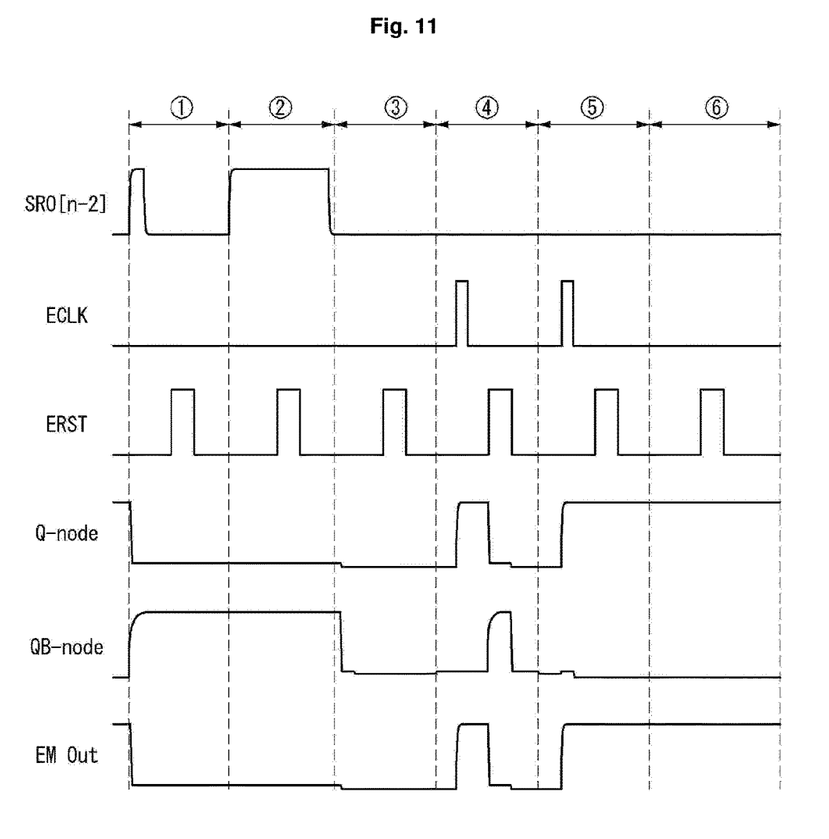
FIG. 11 is a waveform view of input and output waves in the emission signal generation circuit shown in FIG. 10.

FIG. 10 is a diagram illustrating an emission signal generation circuit according to a second embodiment of the present disclosure, and FIG. 11 is a waveform view of input and output waves in the emission signal generation circuit shown in FIG. 10.

As illustrated in FIG. 10, the emission signal generation circuit 140B includes a first circuit INVa for controlling charging and discharging of a Q node Q-node, a second circuit INVb for controlling charging and discharging of the QB node QB-node, and a third circuit INVc for stabilizing an output terminal EMO of the emission signal generation circuit 140B, and a fourth circuit INVd for outputting a Logic-High or Logic-Low emission signal through an output terminal EMO of the emission signal generation circuit 140B.

The first circuit INVa includes a first transistor T1 and a second transistor T2. The first transistor T1 is configured to charge the Q node Q-node to a gate high voltage in response to an N-th clock signal. The second transistor T2 is configured to discharge the Q node Q-node in response to a potential of the QB node QB-node.

The first transistor T1 is configured such that a gate electrode thereof is connected to an N-th clock signal line (which is depicted as a second clock signal line ECLK2 in the embodiment), a first electrode thereof is connected to a gate high voltage line VGH, and a second electrode thereof being connected to the Q node Q-node. The second transistor T2 is configured such that a gate electrode thereof is connected to the QB node QB-node, a first electrode thereof is connected to a gate low voltage line VGL, and a second electrode thereof is connected to the Q node Q-node.

The second circuit INVb includes third to fifth transistors T3 to T5. The third transistor T3 is configured to charge the QB node QB-node to a gate high voltage in response to an output signal of an (N−2)-th shift register. The fourth transistor T4 is configured to reset the QB node using a reset signal in response to the output signal of the N-th shift register. The fifth transistor T5 is configured to discharge the QB node QB-node to a gate low voltage in response to an N-th clock signal.

The third transistor T3 is configured such that a gate electrode thereof is connected to an output terminal SRO[N−2] of the (N−2)-th shift register, a first electrode thereof is connected to the gate high voltage line VGH, and a second electrode thereof is connected to the QB node. The fourth transistor T4 is configured such that a gate electrode thereof is connected to an output terminal SRO[N] of the N-th shift register, a first electrode thereof is connected to a reset signal line ERST, and a second electrode thereof is connected to the QB node QB-node. The fifth transistor T5 is configured such that a gate electrode thereof is connected to an N-th clock signal line (which is depicted as a second clock signal line ECLK2 in the embodiment), a first electrode thereof is connected to a gate low voltage line VGL, and a second electrode thereof is connected to the QB node.

The third circuit INVc includes a sixth transistor T6 and a first capacitor CB. The sixth transistor T6 is configured to stabilize a node connected to electrodes of pull down transistors Tpda and Tpdb in response to a potential of an output terminal EMO of the emission signal generation circuit 140B. By maintaining the node, which is connected to electrodes of the pull down transistors Tpda and Tpdb, at Logic High, the sixth transistor T6 stabilizes an operation of outputting an emission signal at a gate high voltage. The first capacitor CB is configured to cause a boot strap at the output terminal EMO of the emission signal generation circuit 140B. The second capacitor CQB is configured to stabilize a turn-on/turn-off state of the second pull-down transistor Tpdb using the boot strap between the potential of the QB node QB-node and the gate low voltage. The seventh transistor T7 is configured to physically separate the Q node Q-node into one side and the other side so that an emission signal can be stably output from the output terminal EMO of the emission signal generation circuit 140B in response to the gate high voltage.

The sixth transistor T6 is configured such that a gate electrode thereof is connected to the output terminal EMO of the emission signal generation circuit 140B, a first electrode thereof is connected to the gate high voltage line VGH, and a second electrode thereof is connected to a node located between a first electrode of a first pull-down transistor Tpda and a second electrode of a second pull-down transistor Tpdb. The first capacitor CB is configured such that one end thereof is connected to the Q node Q-node and the other end thereof is connected to the output terminal EMO of the emission signal generation circuit 140B. The seventh transistor T7 is configured such that a gate electrode thereof is connected to the gate high voltage line VGH, a first electrode thereof is connected to one side of the Q node being adjacent to the first electrode of the first transistor T1, and a second electrode thereof is connected to one end of the first capacitor CB.

The fourth circuit INVd includes a pull-up transistor Tpu and pull-down transistor Tpda and Tpdb. The pull-up transistor Tpu is configured to output a gate high voltage through the output terminal EMO of the emission signal generation circuit 140B in response to a potential of the Q node Q-node. The pull-down transistors Tpda and Tpdb are each configured to output a gate low voltage through the output terminal EMO of the emission signal generation circuit 140B in response to a potential of the QB node QB-node.

The pull-up transistor Tpu is configured such that a gate electrode thereof is connected to the Q node Q-node, a first electrode thereof is connected to the gate high voltage line VGH, and a second electrode thereof is connected to the output terminal EMO of the emission signal generation circuit 140B. A first pull-down transistor Tpda is configured such that a gate electrode thereof is connected to the QB node QB-node, a first electrode thereof is connected to a second electrode of a second pull-down transistor Tpdb, and a second electrode thereof is connected to the output terminal EMO of the emission signal generation circuit 140B. The second pull-down transistor Tpdb is configured such that a gate electrode thereof is connected to the QB node QB-node and the other end of the second capacitor CQB, a first electrode thereof is connected to the gate low voltage line VGL, and a second electrode thereof is connected to the first electrode of the first pull-down transistor Tpda.

Hereinafter, the operation of the emission signal generation circuit 140B according to the second embodiment of the present disclosure is described.

As illustrated in FIGS. 10 and 11, when the N-th clock signal ECLK is not at Logic High, the Q node Q-node is maintained in a discharging state, while the QB node QB-node is maintained in a charging state. At this point, the second transistor T2 is turned on, the QB node QB-node is discharged, and the first and second pull-down transistors Tpda and Tpdb are turned on. Thus, an emission signal at a gate low voltage corresponding to Logic Low is output from the output terminal EMO of the emission signal generation circuit 140B (see Sections ① and ②).

When a scan signal at a gate high voltage corresponding to Logic High is output from tan output terminal SRO[N−2] of the (N−2)-th shift register and a potential of the QB node QB-node becomes Logic High, the second transistor T2 is turned on. At this point, the Q node Q-node is discharged to a gate low voltage, and the first and second pull-down transistors Tpda and Tpdb are turned on. Thus, an emission signal at the gate low voltage corresponding to Logic Low is output from the output terminal EMO of the emission signal generation circuit 140B (see Section ③).

When a potential of the QB node QB-node is logic low and the first Logic High appears at the N-th clock signal ECLK, the first transistor T1 and the fifth transistor 5 are turned on. At this time the Q node Q-node is charged to the gate high voltage and the pull-up transistor Tpu is turned on. Thus, an emission signal at the gate high voltage corresponding to Logic High is output from the output terminal EMO of the emission signal generation circuit 140B (see Section ④). At this point, the emission signal at the gate high voltage output from the output terminal EMO of the emission signal generation circuit 140 lasts until a section in which the potential of the QB node QB-node is discharged to Logic Low.

When a scan signal at the gate high voltage corresponding to Logic High is output from the output terminal SRO[N] of the N-th shift register and a reset signal ERST becomes Logic High, the QB node QB-node returns to the charging stage. At this point, the second transistor T2 is turned on, the Q node Q-node is discharged, and the first and second pull-down transistors Tpda and Tpdb are turned on. Thus, an emission signal at the gate low voltage corresponding to Logic Low is output from the output terminal EMO of the emission signal generation circuit 140B (see between Sections ④ and ⑤).

When the QB node QB-node is Logic Low and the second Logic High appears at the N-th clock signal ECLK, the first transistor T1 and the fifth transistor T5 are turned on. At this point, the Q node is charged to the gate high voltage, and the pull-up transistor Tpu is turned on. Thus, an emission signal at the gate high voltage corresponding to Logic High is output from the output terminal EMO of the emission signal generation circuit 140B (see Sections ⑤ and ⑥). At this point, the emission signal at the gate high voltage output from the output terminal EMO of the emission signal generation circuit 140B last until a section in which a potential of the QB node QB-node is charged to Logic High.

The above-described scan driver can be applied to any display device which is implemented by sub-pixels having the circuit structure as shown in FIG. 8.

As above, the present disclosure can remove the need of an additional shift register provided in a display device to generate an emission signal, thereby reducing circuit complexity and layout limitation. As a result, the present disclosure can reduce circuit complexity of a scan driver, overcome layout limitation and secure sufficient design margin, thereby improving difficulties in implementing a narrow bezel. In addition, the present disclosure can reduce circuit complexity of a scan driver and secure a sufficient encapsulation margin, thereby improving a device reliability.

Furthermore, the present disclosure is able to adjust a pulse width of an emission signal by means of a clock signal, so that a lateral current is reduced, an initial time can be sufficiently adjusted, thereby a stable driving operations achieved.

It will be apparent to those skilled in the art that various modifications and variations can be made in the present disclosure without departing from the spirit or scope of the disclosure. Thus, it is intended that this present disclosure covers the modifications and variations of this disclosure provided they come within the scope of the appended claims and their equivalents.

What is claimed is:

1. A display device comprising:
   a display panel displaying an image; and
   a scan driver having a scan signal generation circuit on a first side of the display panel and an emission signal generation circuit on a second side of the display panel,
   wherein the emission signal generation circuit outputs an emission signal having at least two Logic High sections in response to an external clock signal and first and second scan signals output from the scan signal generation circuit,
   wherein the emission signal generation circuit comprises:
   a first circuit having first and second transistors to charge and discharge a Q node;
   a second circuit having third to fifth transistors to charge and discharge a QB node;
   a third circuit having a sixth transistor to stabilize an output terminal of the emission signal generation circuit; and
   a fourth circuit having a pull-up transistor and first and second pull-down transistors to output a Logic High emission signal or a Logic Low emission signal through an output terminal of the emission signal generation circuit.

2. The display device of claim 1, wherein
   the third transistor configured to charge the QB node to a gate high voltage in response to the second scan signal of the scan signal generation circuit;
   the fourth transistor configured to reset the QB node using a reset signal in response to the first scan signal of the scan signal generation circuit; and
   the fifth transistor configured to discharge the QB node to a gate low voltage in response to an N-th clock signal.

3. The display device of claim 1, wherein
   the third transistor configured such that a gate electrode thereof is connected to an output terminal of an (N−x)-th shift register of the scan signal generation circuit (where x is an integer equal to or greater than 1), a first electrode thereof is connected to a gate high voltage line, and a second electrode thereof is connected to the QB node;
   the fourth transistor configured such that a gate electrode thereof is connected to an output terminal of an N-th shift register of the scan signal generation circuit, a first electrode thereof is connected to a reset signal line, and a second electrode thereof is connected to the QB node; and the fifth transistor configured such that a gate electrode thereof is connected to an N-th clock signal line, a first electrode thereof is connected to a gate low voltage line, and a second electrode thereof is connected to the QB node.

4. The display device of claim 1, wherein
the sixth transistor configured such that a gate electrode thereof is connected to the output terminal of the emission signal generation circuit, a first electrode thereof is connected to a gate high voltage line, and a second electrode thereof is connected to a node located between a first electrode of the first pull-down transistor and a second electrode of the second pull-down transistor.

5. The display device of claim 4, wherein the third circuit comprises a first capacitor configured such that one end thereof is connected to the Q node and the other end thereof is connected to the output terminal of the emission signal generation circuit.

6. The display device of claim 5, wherein the third circuit comprises:
a second capacitor configured such that one end thereof is connected to a gate electrode of the second pull-down transistor and the other end thereof is connected to a gate low voltage line; and
a seventh transistor configured such that a gate electrode thereof is connected to the gate high voltage line, a first electrode thereof is connected to one side of the Q node being adjacent to the first electrode of the first transistor, and a second electrode thereof is connected to the other side of the Q node being adjacent to the one end of the first capacitor.

7. The display device of claim 1, wherein each of the first scan signal, the second scan signal, and the emission signal has a first signal with a Logic High section and a second signal with a Logic High section, wherein the second signal with the Logic High section is longer than the Logic High section of the first signal.

8. A scan driver for a display panel, comprising:
a scan signal generation circuit on a first side of the display panel; and
an emission signal generation circuit on a second side of the display panel,
wherein the emission signal generation circuit outputs an emission signal having at least two Logic High sections in response to an external clock signal and first and second scan signals output from the scan signal generation circuit,
wherein the emission signal generation circuit comprises:
a first circuit having first and second transistors to charge and discharge a Q node;
a second circuit having third to fifth transistors to charge and discharge a QB node;
a third circuit having a sixth transistor to stabilize an output terminal of the emission signal generation circuit; and
a fourth circuit configured to comprise a pull-up transistor and first and second pull-down transistors to output a Logic High emission signal or a Logic Low emission signal through an output terminal of the emission signal generation circuit.

9. The scan driver of claim 8, wherein
the third transistor configured such that a gate electrode thereof is connected to an output terminal of an (N−x)-th shift register of the scan signal generation circuit (where x is an integer equal to or greater than 1), a first electrode thereof is connected to a gate high voltage line, and a second electrode thereof is connected to the QB node;
the fourth transistor configured such that a gate electrode thereof is connected to an output terminal of an N-th shift register of the scan signal generation circuit, a first electrode thereof is connected to a reset signal line, and a second electrode thereof is connected to the QB node; and
the fifth transistor configured such that a gate electrode thereof is connected to an N-th clock signal, a first electrode thereof is connected to a gate low voltage line, and a second electrode thereof is connected to the QB node.

* * * * *